(12) United States Patent
Ma et al.

(10) Patent No.: US 6,865,307 B1
(45) Date of Patent: Mar. 8, 2005

(54) METHOD FOR FORMING AN OPTICAL PRINTED CIRCUIT BOARD

(75) Inventors: Kelvin Ma, Clifton Park, NY (US); Todd R. Tolliver, Clifton Park, NY (US); John J. Soderberg, Acworth, GA (US)

(73) Assignee: Lockheed Martin Corporation, Bethesda, MD (US)

(*) Notice: Subject to any disclaimer, the term of this patent is extended or adjusted under 35 U.S.C. 154(b) by 42 days.

(21) Appl. No.: 10/620,822

(22) Filed: Jul. 16, 2003

(51) Int. Cl.[7] .................. G02B 6/12; G02B 6/132; G02B 6/10; G02B 6/26; B44C 1/00
(52) U.S. Cl. .............. 385/14; 156/234; 430/270.1; 385/129; 438/31
(58) Field of Search .................. 385/2–16, 31, 385/37, 39, 42, 50, 129, 147, 47–48; 156/234, 240, 230, 235; 430/270.1, 311, 313, 326; 438/31, 107, 128, 464

(56) References Cited

U.S. PATENT DOCUMENTS

| | | | | |
|---|---|---|---|---|
| 6,343,171 B1 | * | 1/2002 | Yoshimura et al. | 385/50 |
| 6,611,635 B1 | * | 8/2003 | Yoshimura et al. | 385/14 |
| 6,669,801 B2 | * | 12/2003 | Yoshimura et al. | 156/230 |
| 6,684,007 B2 | * | 1/2004 | Yoshimura et al. | 385/31 |
| 6,690,845 B1 | * | 2/2004 | Yoshimura et al. | 385/14 |
| 6,706,546 B2 | * | 3/2004 | Yoshimura et al. | 438/31 |
| 6,741,781 B2 | * | 5/2004 | Furuyama | 385/129 |
| 6,785,447 B2 | * | 8/2004 | Yoshimura et al. | 385/42 |
| 6,803,171 B2 | * | 10/2004 | Gronbeck et al. | 430/270.1 |
| 2002/0028045 A1 | * | 3/2002 | Yoshimura et al. | 385/50 |
| 2002/0036055 A1 | * | 3/2002 | Yoshimura et al. | 156/234 |
| 2002/0039464 A1 | * | 4/2002 | Yoshimura et al. | 385/14 |
| 2002/0097962 A1 | * | 7/2002 | Yoshimura et al. | 385/50 |

* cited by examiner

Primary Examiner—Akm Enayet Ullah
(74) Attorney, Agent, or Firm—Baker Botts L.L.P.

(57) ABSTRACT

According to one embodiment of the invention, a method includes providing a printed circuit board having a plurality of optoelectronic components coupled to a first side of the printed circuit board, forming a first clad layer outwardly from the first side of the printed circuit board, coupling an injection molding mold to the first side of the printed circuit board, injecting a material into the mold in liquid form, and after the material is solidified, decoupling the injection molding mold from the first side of the printed circuit board, thereby forming an optical waveguide outwardly from the first clad layer. The method may also include forming a second clad layer outwardly from the optical waveguide, and forming a metal layer outwardly from the second clad layer. In lieu of injection molding, stamping may be performed to form the core layer of the optical waveguide.

24 Claims, 4 Drawing Sheets

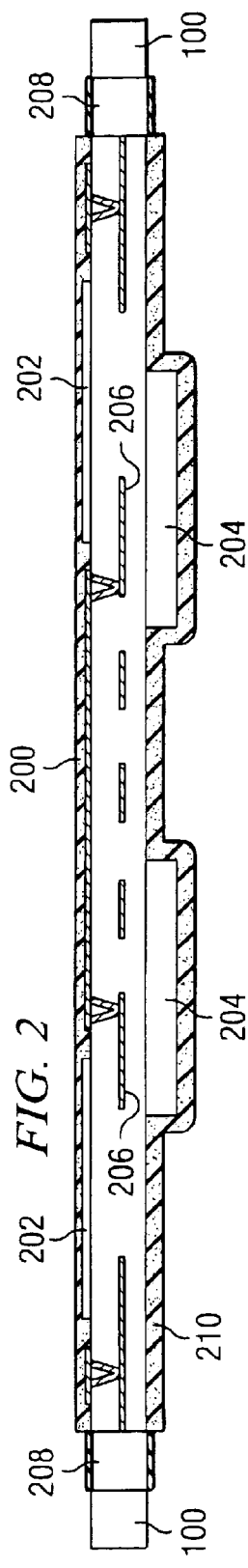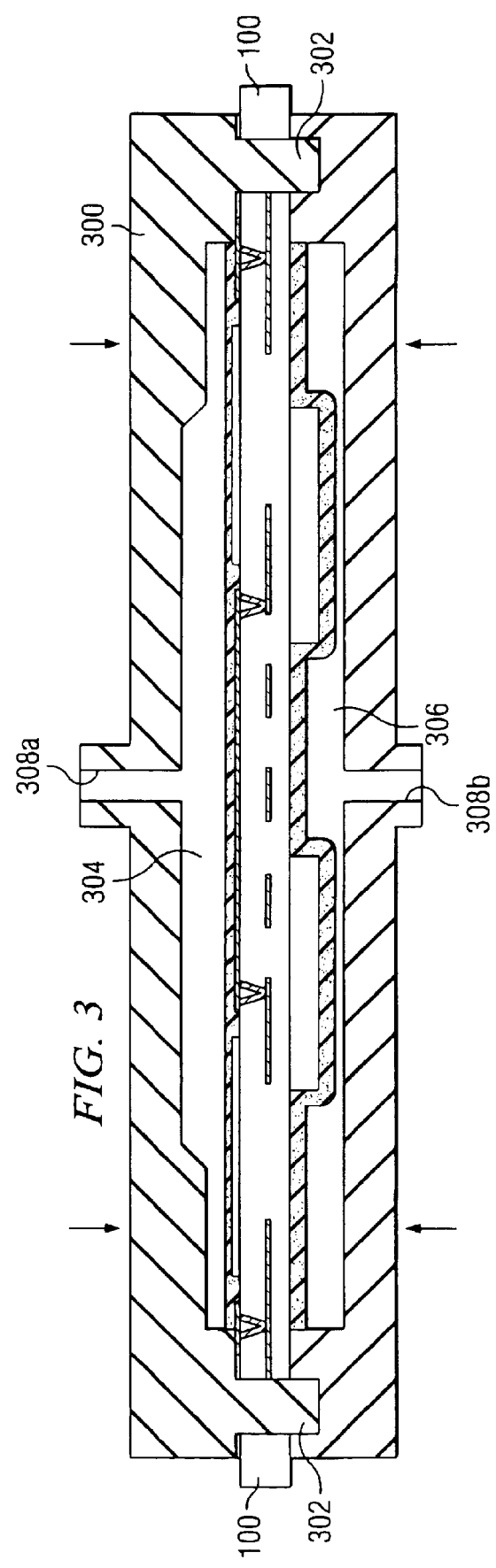

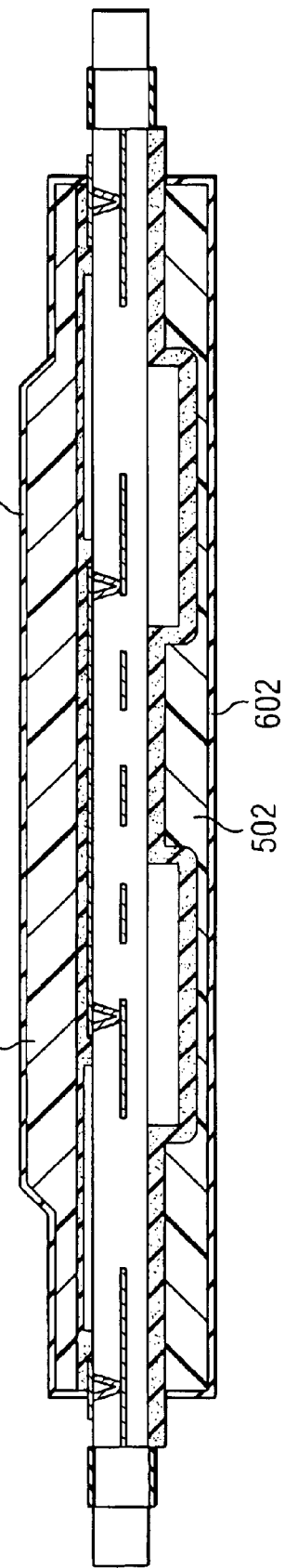
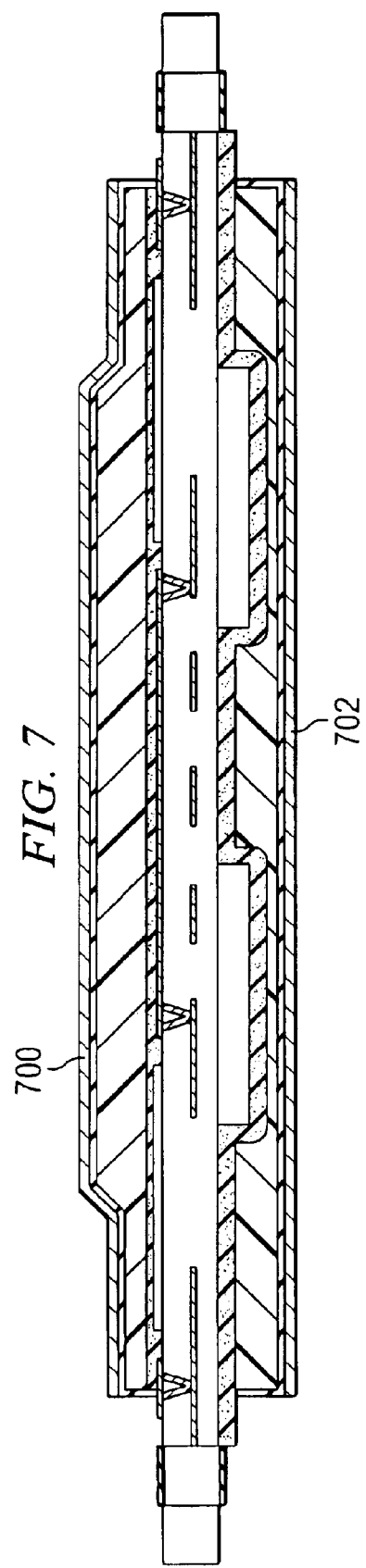

METHOD FOR FORMING AN OPTICAL PRINTED CIRCUIT BOARD

TECHNICAL FIELD OF THE INVENTION

The present invention relates generally to the field of printed circuit board manufacturing and, more particularly, to a method for forming an optical printed circuit board.

BACKGROUND OF THE INVENTION

Printed circuit boards are used in many applications, including cell phones, stereo equipment, and computers, just to name a few. Nowadays, the components associated with these printed circuit boards include electronic as well as optoelectronic components. The use of optoelectronic components resulted from the continuing increase in clock speed of the electronic components, which resulted in electrical interconnect bottlenecks, especially in the context of long interconnect bus architecture. However, the integration of optical, electronic, and optoelectronic components has been difficult and very manual labor intensive, which results in high manufacturing costs and low volume throughput.

SUMMARY OF THE INVENTION

According to one embodiment of the invention, a method includes providing a printed circuit board having a plurality of optoelectronic components coupled to a first side of the printed circuit board, forming a first clad layer outwardly from the first side of the printed circuit board, coupling an injection molding mold to the first side of the printed circuit board, injecting a material into the mold in liquid form, and after the material is solidified, decoupling the injection molding mold from the first side of the printed circuit board, thereby forming an optical waveguide outwardly from the first clad layer. The method may also include forming a second clad layer outwardly from the optical waveguide, and forming a metal layer outwardly from the second clad layer. In lieu of injection molding, stamping may be performed to form the core layer of the optical waveguide.

Embodiments of the invention provide a number of technical advantages. Embodiments of the invention may include all, some, or none of these advantages. In one embodiment, a manufacturing method achieves high-speed optical communication between different sections of a printed circuit board. This eliminates any bottlenecks that may occur as a result of increasing clock speeds for electrical components. The manufacturing method results in low-cost optical printed circuit board integration that combines both optical, electrical, and optoelectronic components in a single heterogeneous package. The manufacturing method is also particularly suitable for flex circuits that have thin substrates.

Other technical advantages are readily apparent to one skilled in the art from the following figures, descriptions, and claims.

BRIEF DESCRIPTION OF THE DRAWINGS

For a more complete understanding of the invention, and for further features and advantages, reference is now made to the following description, taken in conjunction with the accompanying drawings, in which:

FIG. 2 is a cross-sectional elevation view of the flex circuit of FIG. 1 illustrating the forming of a clad layer;

FIG. 3 is a cross-sectional elevation view illustrating an injection molding mold for the flex circuit of FIG. 2;

FIG. 6 is a cross-sectional elevation view illustrating the forming of an additional clad layer to the flex circuit of FIG. 5; and FIG. 7 is a cross-sectional elevation view illustrating the forming of a metal layer to the flex circuit of FIG. 6.

DETAILED DESCRIPTION

Figure 1:
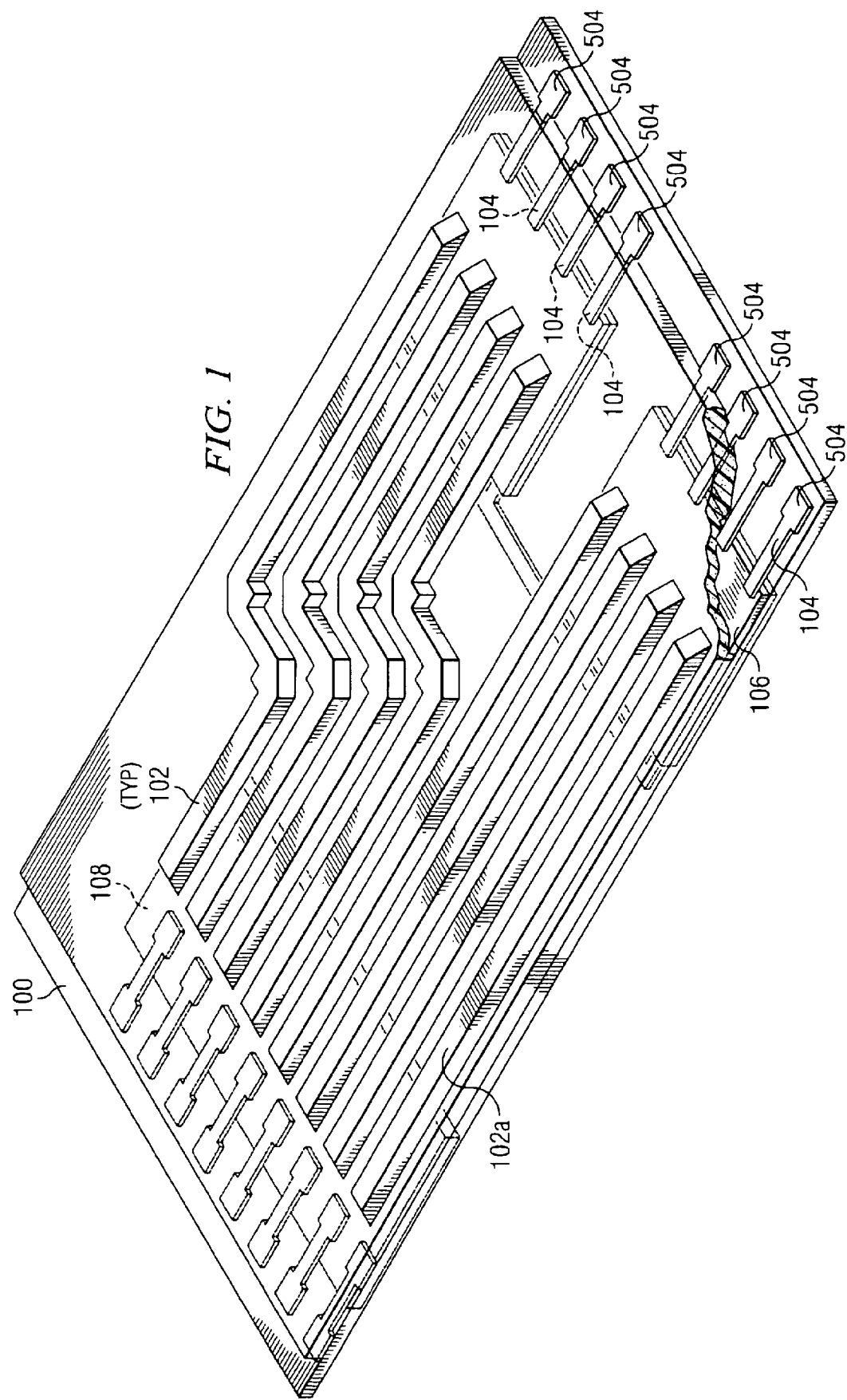
FIG. 1 is a perspective view of a flex circuit having optical wave guides formed thereon according to one embodiment of the invention.

FIG. 1 is a perspective view of a printed circuit board ("PCB") 100 having one or more optical waveguides 102 formed thereon according to an embodiment of the present invention. PCB 100 is described in greater detail below in conjunction with FIGS. 2 through 7. Generally, PCB 100 includes a plurality of electronic and optoelectronic components coupled thereto that are connected to one another by a plurality of metal traces 104 in such a manner as to form one or more electrical circuits. An example of PCB 100 is a mother board for a computer; however, the present invention contemplates PCB 100 representing any circuit board, printed wiring board, flex circuit, or other suitable substrate having electronic and optoelectronic components coupled thereto. PCB 100 may have any suitable size and any suitable shape and may be formed form any suitable material.

Waveguides 102 are formed by any suitable arrangement of optically transmissive material that communicates optical signals as guided waves of energy from an optoelectronic component associated with PCB 100 to another optoelectronic component associated with PCB 100. For example, a vertical cavity surface emitting laser ("VCSEL") 106 associated with an optoelectronic component on PCB 100 emits light waves representing one or more electrical signals and these light waves travel through an optical waveguide 102a before reaching a photodiode detector 108 associated with another optoelectronic component of PCB 100, in which the light waves are then converted back to electrical signals. Optical waveguides 102 may comprise multi-mode waveguides or single mode waveguides having any suitable cross-section. One technical advantage of having waveguides 102 formed on PCB 100 is that a much higher bus speed may be achieved through optical communication rather than electrical communication. This increased speed may be significant even when dealing with distances between components on a printed circuit board that may be only a few inches apart. A method of manufacturing waveguides 102 on PCB 100 is described in detail below in conjunction with FIGS. 2 through 7.

FIGS. 2 through 7 illustrate one method of forming optical waveguides 102 on one side of PCB 100. The present invention docs, however, contemplate the forming of optical waveguides 102 on both sides of PCB 100.

FIG. 2 is a cross-sectional elevation view of PCB 100 illustrating the forming of a clad layer 200 outwardly from a side of PCB 100. In the illustrated embodiment, PCB 100 is a flex circuit formed from a polyimide that includes one or more optoelectronic components 202 on one side and one or more electronic components 204 formed on the other side. Although optoelectronic components 202 are shown to be coupled to PCB 100 on one side and electronic components 204 shown to be coupled to the other side of PCB 100, the present invention contemplates any suitable location for both optoelectronic components 202 and electronic components 204, including optoelectronics components 202 and/or electronic components 204 embedded within PCB 100. Also shown in FIG. 2 is a plurality of metal traces 206 embedded within PCB 100. Metal traces 206 function to connect components associated with PCB 100, such as optoelectronic components 202 and electronic components 204. Although only one "layer" of metal traces 206 is illustrated, any number of suitable electrical interconnection layers may be utilized. PCB 100 also includes one or more alignment holes 208 formed in an outer periphery of PCB 100. Alignment holes 208, as described in further detail below, function to align an injection molding mold 300 (FIG. 3) with PCB 100. Alignment holes 208 may have any suitable shape and any suitable size. For example, alignment holes 208 may be holes formed with a diameter of approximately ten mils. Alignment holes 208 may or may not extend through the full thickness of PCB 100.

Clad layer 200 functions to form a cladding for optical waveguides 102. In general, a cladding for an optical waveguide prevents light waves from escaping the core during transmission. Clad layer 200 may be formed from any suitable material using any suitable method and may have any suitable thickness. In one embodiment, clad layer 200 is formed from a material that is optically transparent to the wavelength that is desired to be transmitted. As an example, clad layer 200 may be formed from a suitable optical polymer material, such as Lexan®. In addition, a spin coat, spray coat, or other suitable deposition technique may be used to form clad layer 200. In order to avoid performance degradation of optical waveguides 102, it is important that clad layer 200 have good planarization. An exemplary surface planarity for clad layer 200 is less than one micron for every five inches of length.

In one embodiment of the present invention, a clad layer 210 is formed on the other side of PCB 100. Clad layer 210 helps to prevent or reduce warpage of PCB 100 and clad layer 200 by balancing any thermal stresses that may occur due to different coefficient of thermal expansions between clad layer 200 and PCB 100. Clad layer 210, similar to clad layer 200, may be formed from any suitable material using any suitable method and may have any suitable thickness.

FIG. 3 is a cross-sectional elevation view illustrating injection molding mold 300 according to one embodiment of the present invention. Injection molding mold 300, which may be formed from any suitable material, couples to PCB 100 by engaging one or more protuberances 302 of injection molding mold 300 with alignment holds 208 of PCB 100. In the illustrated embodiment, injection molding mold 304 includes a first cavity 304, a second cavity 306, and a pair of inlets 308. The shape of cavity 304 defines the shape of optical waveguides 102. Cavity 306, on the other hand, may have any suitable shape. However, if optical waveguides are being formed on both sides of PCB 100 then the shape of cavity 306 defines the optical waveguides being formed on that particular side of PCB 100. Inlet 308a functions to introduce the material used to form waveguides 102 into cavity 304, and inlet 308b functions to introduce the material into cavity 306. The injection molding process is described in greater detail below in conjunction with FIG. 4.

Figure 4:
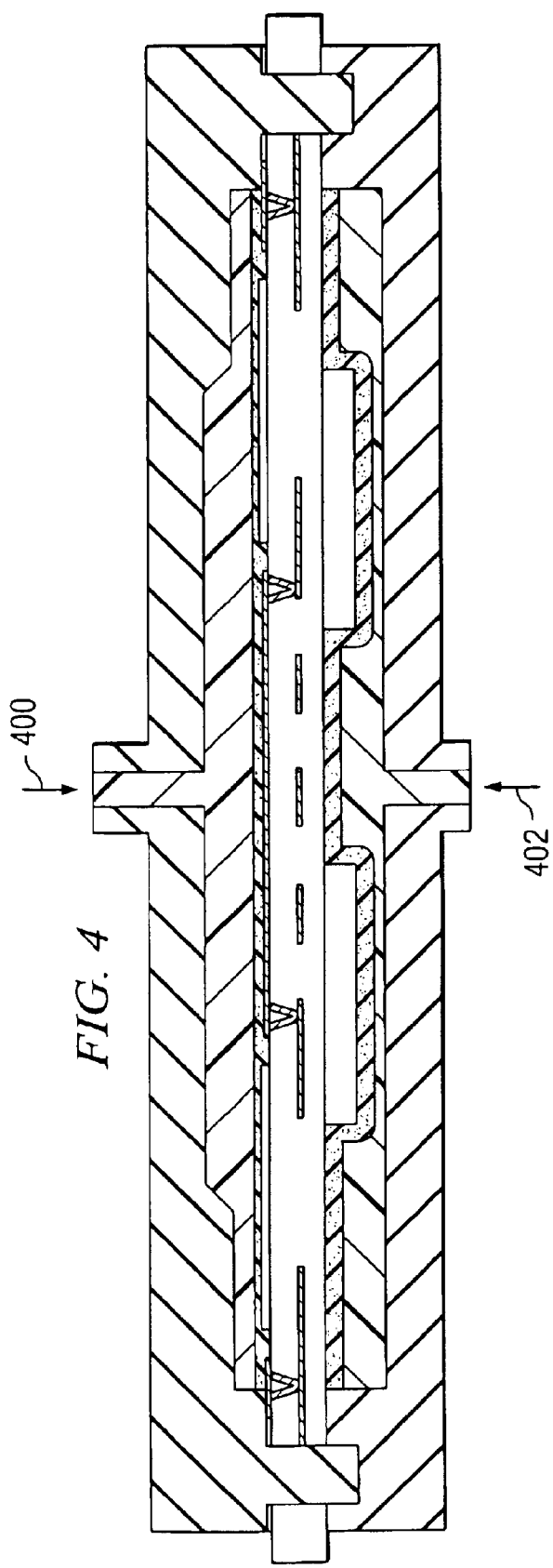
FIG. 4 is a cross-sectional elevation view illustrating the injection molding of a polymer to form the optical wave guides illustrated in FIG. 1.

FIG. 4 is a cross-sectional elevation view illustrating the injection molding of a polymer to form optical waveguides 102. Any suitable injection molding process may be utilized. As illustrated in FIG. 4, an arrow 400 illustrates the injection of a polymer into cavity 304 in order to form waveguides 102 and an arrow 402 illustrates the injecting of a polymer into cavity 306. Generally, the polymer (or other suitable material) is injected into cavities 304 and 306 in a liquid form and thereafter solidifies. The material used to form waveguides 102 determines the injection temperature for the material, which may be any suitable temperature. In addition, the type of material determines whether or not a curing cycle is required. Typically, once the material solidifies after injection, mold 300 is removed from PCB 100. This result is illustrated in FIG. 5.

Figure 5:
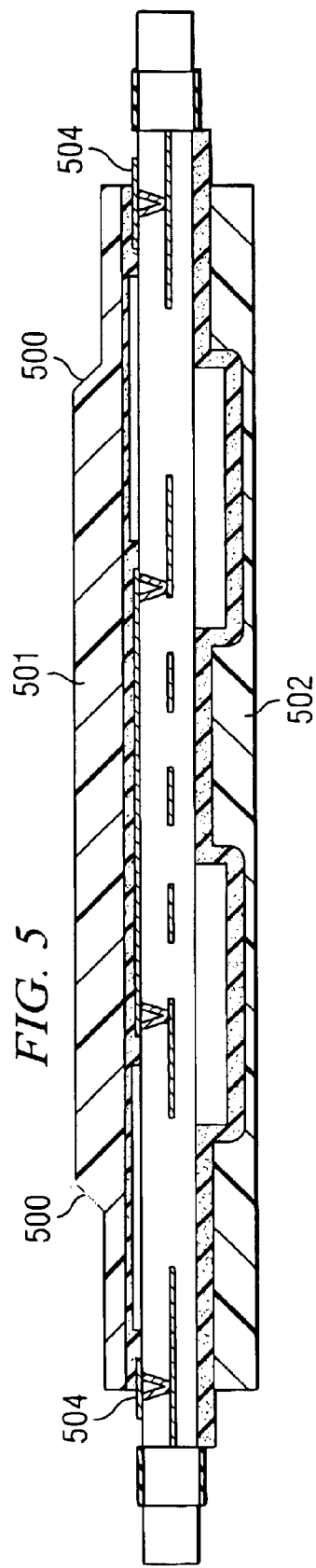
FIG. 5 is a cross-sectional elevation view illustrating the flex circuit of FIG. 4 after removal of the mold.

FIG. 5 is a cross-sectional elevation view illustrating PCB 100 after removal of injection molding mold 300. As illustrated, a core 501 of a particular waveguide 102 has now been formed. Core 501 may take on any suitable form and may be formed from any suitable material, such as any suitable optical polymer. It is important that the material used to form core 501 should have a higher index of refraction than the material used to form clad layer 200. In a particular embodiment of the present invention, the ends of core 501 have an angle of approximately 45°, as denoted by reference numeral 500. This enables the light waves being emitted by, for example, VCSEL laser 106 to deflect off of angled surface 500 at a 90° angle. Other suitable shapes are contemplated by the present invention for the ends, as well as the cross-section of core 501. Also illustrated in FIG. 5 is a polymer layer 502 that is used to balance any thermal stresses that may occur due to the different coefficient of thermal expansions between core 501 and PCB 100 to prevent or reduce warpage.

Also illustrated in FIG. 5 are contact pads 504 extending outwardly from the edges of waveguides 102. Contact pads 504 are also illustrated in better detail in FIG. 1. The waveguides are formed in such a manner as to allow contact pads 504 to be exposed on PCB 100 so that suitable electrical contacts may be made to contact pads 504.

FIG. 6 is a cross-sectional elevation view illustrating the forming of an additional clad layer 600 outwardly from cores 501 in accordance with an embodiment of the present invention. Even though the addition of clad layer 600 to cores 501 is an optional step, it may serve a few useful purposes. First, clad layer 600 may function similarly to clad layer 200 in that it covers cores 501 to prevent light waves from escaping cores 501 during transmission, and second layer 600 may provide protection for cores 501 to avoid any scratches or other imperfections that may deteriorate the performance of waveguides 102. Any suitable material may be used to form clad layer 600; however, the material should have a lower index of refraction than that used to form cores 501. In addition, any suitable method may be used to form clad layer 600, such as spin coating, spray coating, or other suitable deposition technique. The planarity of clad layer 600 is not as important as the planarity of clad layer 200. Also illustrated in FIG. 6 is a clad layer 602 formed outwardly from polymer layer 502 that functions to balance any thermal stresses that may occur due to the different coefficients of thermal expansion between clad layer 600 and PCB 100 to prevent or reduce warpage.

FIG. 7 is a cross-sectional elevation view illustrating the forming of a metal layer 700 outwardly from clad layer 600 in accordance with an embodiment of the present invention. Although the forming of metal layer 700 is an option in the method outlined in FIGS. 2 through 7, it may serve a few useful purposes. First, it may provide additional light confinement, and second, it may provide electrical shielding for electrical components associated with PCB 100. Any suitable metal may use to form metal layer 700 and it may be formed using any suitable method. Also illustrated in FIG. 7 is a metal layer 702 formed outwardly from clad layer

602. Metal layer 702 may be used to balance any thermal stresses that may occur due to the different coefficient of thermal expansions between metal layer 700 and PCB 100 to prevent or reduce warpage.

Although embodiments of the invention and their advantages are described in detail, a person skilled in the art could make various alterations, additions, and omissions without departing from the spirit and scope of the present invention as defined by the appended claims.

What is claimed is:

1. A method, comprising:
   providing a printed circuit board having a plurality of optoelectronic components coupled to a first side of the printed circuit board;
   forming a first clad layer outwardly from the first side of the printed circuit board;
   coupling an injection molding mold to the first side of the printed circuit board;
   injecting a material into the mold in liquid form; and
   after the material is solidified, decoupling the injection molding mold from the first side of the printed circuit board, thereby forming an optical waveguide outwardly from the first clad layer.

2. The method of claim 1, further comprising forming a second clad layer outwardly from the optical waveguide.

3. The method of claim 2, further comprising forming a metal layer outwardly from the second clad layer.

4. The method of claim 1, wherein the printed circuit board is a flex circuit.

5. The method of claim 1, further comprising causing one or more contact pads formed on the printed circuit board to be exposed after the forming of the first clad layer and the optical waveguide.

6. The method of claim 1, wherein coupling the injection molding mold to the first side of the printed circuit board comprises coupling the injection molding mold to a plurality of alignment holes formed in the printed circuit board.

7. A method, comprising:
   providing a printed circuit board having a plurality of optoelectronic components coupled to a first side of the printed circuit board;
   forming a first clad layer outwardly from the first side and a second side of the printed circuit board;
   encapsulating a portion of the printed circuit board with an injection molding mold;
   injecting a polymer into the mold in liquid form; and
   after the polymer solidifies, decoupling the injection molding mold from the first and second sides of the printed circuit board, thereby forming an optical waveguide on the first side of the printed circuit board and a polymer layer on the second side of the printed circuit board.

8. The method of claim 7, further comprising forming a second clad layer outwardly from the optical waveguide and the polymer layer.

9. The method of claim 8, further comprising forming a metal layer outwardly from the second clad layer.

10. The method of claim 7, wherein the printed circuit board is a flex circuit.

11. The method of claim 7, further comprising causing one or more contact pads formed on the printed circuit board to be exposed after the forming of the first clad layer and the optical waveguide.

12. The method of claim 7, further comprising coupling the injection molding mold to a plurality of alignment holes formed in the printed circuit board.

13. A printed circuit board, comprising:
   a substrate;
   a plurality of metal traces associated with the substrate;
   a plurality of optoelectronic components formed on a first side of the substrate;
   a first clad layer formed outwardly from, and encapsulating, the optoelectronic components;
   a second clad layer formed outwardly from a second side of the substrate;
   a plurality of optical waveguides formed outwardly from the first clad layer, the optical waveguides coupling respective pairs of optoelectronic components; and
   a polymer layer formed outwardly from the second clad layer.

14. The printed circuit board of claim 13, further comprising:
   a third clad layer formed outwardly from the optical waveguides;
   a fourth clad layer formed outwardly from the polymer layer;
   a first metal layer formed outwardly from the third clad layer; and
   a second metal layer formed outwardly from the fourth clad layer.

15. The printed circuit board of claim 13, wherein the substrate is formed from a polyimide.

16. The printed circuit board of claim 13, wherein the optical waveguides have a substantially planar top, a substantially planar bottom, and ends that are formed at an angle of approximately 45 degrees to the vertical.

17. The printed circuit board of claim 13, further comprising a plurality of contact pads associated with at least some of the metal traces, the contact pads existing around a perimeter of the substrate and exposed to the environment after the formed of the optical waveguides.

18. The printed circuit board of claim 13, wherein the first and second clad layers are formed from a material having substantially the same coefficient of thermal expansion.

19. The printed circuit board of claim 13, wherein the optical waveguides and the polymer layer are formed from a material having substantially the same coefficient of thermal expansion.

20. The printed circuit board of claim 13, wherein the first clad layer has a planarity of less than one micron per five linear inches.

21. A method, comprising:
   providing a printed circuit board having a plurality of optoelectronic components coupled to a first side of the printed circuit board;
   forming a first clad layer outwardly from the first side of the printed circuit board;
   forming a first optical core layer outwardly from the first clad layer; and
   stamping the first optical core layer to form an optical waveguide outwardly from the first clad layer.

22. The method of claim 21, further comprising forming a second clad layer outwardly from the optical waveguide.

23. The method of claim 22, further comprising forming a metal layer outwardly from the second clad layer.

24. The method of claim 21, wherein the printed circuit board is a flex circuit.

* * * * *